(12) United States Patent  (10) Patent No.: US 8,645,880 B2
Adam  (45) Date of Patent: *Feb. 4, 2014

(54) SUM OF COHERENT SYSTEMS (SOCS) APPROXIMATION BASED ON OBJECT INFORMATION

(75) Inventor: Konstantinos Adam, Belmont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 18 days.

This patent is subject to a terminal disclaimer.

(21) Appl. No.: 12/945,674

(22) Filed: Nov. 12, 2010

(65) Prior Publication Data

US 2011/0119643 A1  May 19, 2011

Related U.S. Application Data

(63) Continuation of application No. 11/715,667, filed on Mar. 8, 2007, now Pat. No. 7,836,423.

(60) Provisional application No. 60/780,191, filed on Mar. 8, 2006.

(51) Int. Cl.
*G06F 17/50*  (2006.01)

(52) U.S. Cl.
USPC ............................................. 716/56; 716/54

(58) Field of Classification Search
USPC ...................................................... 716/50–55
See application file for complete search history.

(56) References Cited

U.S. PATENT DOCUMENTS

| 5,447,810 | A  | 9/1995 | Chen et al. |
| 6,738,859 | B2 | 5/2004 | Liebchen |
| 7,079,223 | B2 | 7/2006 | Rosenbluth et al. |
| 7,266,480 | B2 | 9/2007 | Adam |

(Continued)

OTHER PUBLICATIONS

Adam, "Domain Decomposition Methods for the Electromagnetic Simulation of Scattering from Three-Dimensional Structures with Applications in Lithography," Ph.D. Dissertation, University of California, Berkeley, 195 pp. (Fall 2001).

(Continued)

*Primary Examiner* — Binh Tat
(74) *Attorney, Agent, or Firm* — Klarquist Sparkman, LLP (57) ABSTRACT

A method for determining kernels in a sum of coherent systems (SOCS) approximation is provided. Information for an object to be simulated in a manufacturing process is determined. For example, information based on geometries that are included in a layout or mask is determined. A set of kernels from a transmission cross coefficient (TCC) matrix are also determined. The set of kernels may be weighted by importance values in an order of importance. The kernels may then be re-ordered based on the information for the object. These kernels are then re-ordered in the SOCS series to reflect their order of importance. The SOCS series of kernels is then truncated at the number of kernels desired. Accordingly, by re-ordering the kernels that may be more relevant to the object to include higher weights, when the truncation occurs, the kernels that are most relevant may be included in the SOCS approximation.

20 Claims, 7 Drawing Sheets

(56) References Cited

U.S. PATENT DOCUMENTS

| | | | |
|---|---|---|---|
| 7,266,803 B2 | 9/2007 | Chou et al. | |
| 7,310,796 B2 * | 12/2007 | Schwarzband | 382/144 |
| 7,331,033 B2 * | 2/2008 | Feldman | 716/51 |
| 7,378,202 B2 | 5/2008 | Granik et al. | |
| 7,467,072 B2 | 12/2008 | Adam | |
| 7,512,927 B2 * | 3/2009 | Gallatin et al. | 716/51 |
| 7,536,660 B2 | 5/2009 | Adam | |
| 7,539,954 B2 | 5/2009 | Adam | |
| 7,836,423 B2 * | 11/2010 | Adam | 716/52 |
| 2003/0064298 A1 | 4/2003 | Broeke et al. | |
| 2005/0015233 A1 | 1/2005 | Gordon | |
| 2005/0091631 A1 | 4/2005 | Gallatin et al. | |
| 2006/0048090 A1 * | 3/2006 | Feldman | 716/21 |
| 2007/0081137 A1 | 4/2007 | Lin | |
| 2007/0253637 A1 | 11/2007 | Adam | |

OTHER PUBLICATIONS

Adam et al., "Efficient phase defect modeling using domain decomposition methods," *J. Vac. Sci. Technol. B*, vol. 20, No. 6, pp. 3035-3039 (Dec. 2002).

Adam et al., "Methodology for Accurate and Rapid Simulation of Large Arbitrary 2D Layouts of Advanced Photomasks," *21st Annual Bacus Symp. on Photomask Technology*, 18 pp. (Oct. 2001).

Adam et al., "Simplified Models for Edge Transitions in Rigorous Mask Modeling," *Int'l Symp. on Microlithography*, 14 pp. (Mar. 2001).

Cobb et al., "Fast Sparse Aerial Image Calculation for OPC," *Proc. SPIE*, vol. 178, pp. 805-816 (2004) [reprint of Cobb et al., "Fast Sparse Aerial Image Calculation for OPC," Proc. SPIE, vol. 2621, pp. 534-545 (Dec. 1995)].

\* cited by examiner

SUM OF COHERENT SYSTEMS (SOCS) APPROXIMATION BASED ON OBJECT INFORMATION

CROSS-REFERENCES TO RELATED APPLICATIONS

This is a continuation of prior U.S. patent application Ser. No. 11/715,667 entitled "SUM OF COHERENT SYSTEMS (SOCS) APPROXIMATION BASED ON OBJECT INFORMATION," filed on Mar. 8, 2007, which claims the benefit of U.S. Provisional Patent Application No. 60/780,191 entitled "HYBRID HOPKINS-ABBE SOCS METHOD WITH GEOMETRY-AWARE SOCS TRUNCATION," filed on Mar. 8, 2006, both of which are hereby incorporated by reference in their entirety.

BACKGROUND

Particular embodiments generally relate to photolithographic processing and more specifically to a sum of coherent systems (SOCS) approximation optimization.

Lithographic and other processes often have certain signature distortions that fabricate less than optimal features in integrated microdevices. If these distortions can be modeled, the device layout or design can be compensated in anticipation of these fabrication problems. OPC (Optical and Process Correction, or sometimes Optical Proximity Correction) involves making systematic modifications to photomask geometries to increase the achievable resolution and pattern transfer fidelity for photolithography in IC manufacturing. This is accomplished by compensating mask geometry for predictable effects that will occur during imaging or subsequent processing.

A simulation engine is used to provide an accurate simulation of the on-wafer shape, given an input shape on the mask. Conventional simulation engines use the Sum of Coherent Systems (SOCS) approximation, in which on-wafer light intensity for partially coherent illumination is decomposed into an incoherent sum of intensities from a nominally infinite number of coherent systems. The sum of coherent systems (SOCS) approximation may be used to approximate a Hopkins imaging integral. For example, a transmission cross coefficient (TCC) matrix may be decomposed via Eigenvalue decomposition (EVD) into a finite set of kernels (SOCS kernels) whose order of importance in the SOCS series coincides with the magnitude of the respective Eigenvalue. The number of kernels in a SOCS series is large and thus, the SOCS approximation uses only a finite number of kernels, N. The number N is determined to balance accuracy and time taken to compute the sum. For example, the series may be cut off after the first ten or twenty kernels.

The transmission cross coefficients (TCCs) are generated based on the illumination source and projection system being used. Thus, no matter what mask is being used to determine the image intensity, the same finite set of kernels is used. This may be produce results that are not as accurate and/or may not be the most computationally efficient for a particular photomask layout.

SUMMARY

In one embodiment, a method for determining kernels in a sum of coherent systems approximation is provided. Information for an object to be simulated in a manufacturing process is determined. For example, information based on geometries that are included in a layout or photomask is determined. A set of kernels from a transmission cross coefficient (TCC) matrix are also determined. The set of kernels may be weighted by importance values in an order of importance in a SOCS series. The kernels may then be re-ordered based on the information for the object. For example, the geometry information for the object is used to determine which kernels may be more relevant for the object. These kernels are then re-ordered in the SOCS series to reflect their order of importance. The SOCS series of kernels is then truncated at the number of kernels desired. Accordingly, by re-ordering the kernels that may be more relevant to the object to have higher weights, when the truncation occurs, the kernels that are most relevant may be included in the SOCS approximation. Thus, more accurate image intensities may be determined when using the SOCS approximation in a Hopkins approach.

In one embodiment, a method for determining kernels in a sum of coherent systems (SOCS) approximation is provided. The method comprises: determining information for an object to be simulated for a manufacturing process; determining a set of kernels that represent a transmission cross coefficient (TCC) matrix, wherein the kernels in the set are associated with importance values; analyzing the set of kernels and information for the object to determine if one or more of the kernels in the set of kernels should have a different importance value; and assigning a different importance value for one or more kernels in the set of kernels based on the analysis.

In another embodiment, a computer readable medium comprising one or more instructions for execution by the one or more processors is provided. The one or more instructions are configured to determine kernels in a sum of coherent systems (SOCS) approximation and when executed by the one or more processors operable to: determine information for an object to be simulated for a manufacturing process; determine a set of kernels that represent a transmission cross coefficient (TCC) matrix, wherein the kernels in the set are associated with importance values; analyze the set of kernels and information for the object to determine if one or more of the kernels in the set of kernels should have a different importance value; and assign a different importance value for one or more kernels in the set of kernels based on the analysis.

In yet another embodiment, a system configured to determine kernels in a sum of coherent systems (SOCS) approximation is provided. The system comprises: an object information determiner configured to determine information for an object to be simulated for a manufacturing process; a SOCS series determiner configured to determine a set of kernels that represent a transmission cross coefficient (TCC) matrix, wherein the kernels in the set are associated with importance values; a kernel analyzer configured to analyze the set of kernels and information for the object to determine if one or more of the kernels in the set of kernels should have a different importance value; a kernel reorder configured to assign a different importance value for one or more kernels in the set of kernels based on the analysis; and a model determiner configured to generate a model for an image intensity to be used in simulating optical effects of the object in the manufacturing process.

A further understanding of the nature and the advantages of particular embodiments disclosed herein may be realized by reference of the remaining portions of the specification and the attached drawings.

DETAILED DESCRIPTION OF EMBODIMENTS

To produce modern microdevices such as integrated circuits with photolithographic techniques, most photolithographic reticles or photomasks employ some sort of resolution enhancement technology (RET). Examples of RETs include optical and process correction (OPC, sometimes also called optical proximity correction) that may be used to determine distortions that may occur in a lithographic processing to improve the ability of the system to print a desired pattern of objects on a semiconductor wafer. Although photolithography is described, it will be understood that particular embodiments may be used in other processes, such as phase-shifting masks (PSM), chemical mechanical processing (CMP), etch, etc.

To apply these RETs, the effect of these distortions on the actual geometric structures of a microdevice is simulated. The impact of the distortions may be determined and features in a layout may be changed to account for the distortions that may occur.

Particular embodiments simulate the image intensity at a plane for a given photomask layout pattern using a particular illumination source. The image intensity may be used to perform OPC or RET techniques. A SOCS approximation may be used in the computation of the image intensity. Particular embodiments reorder a series of kernels derived from a transmission cross coefficient (TCC) function based on object information. The object information may be geometric information for an object, such as a photomask, being used in a simulation process.

Figure 1:
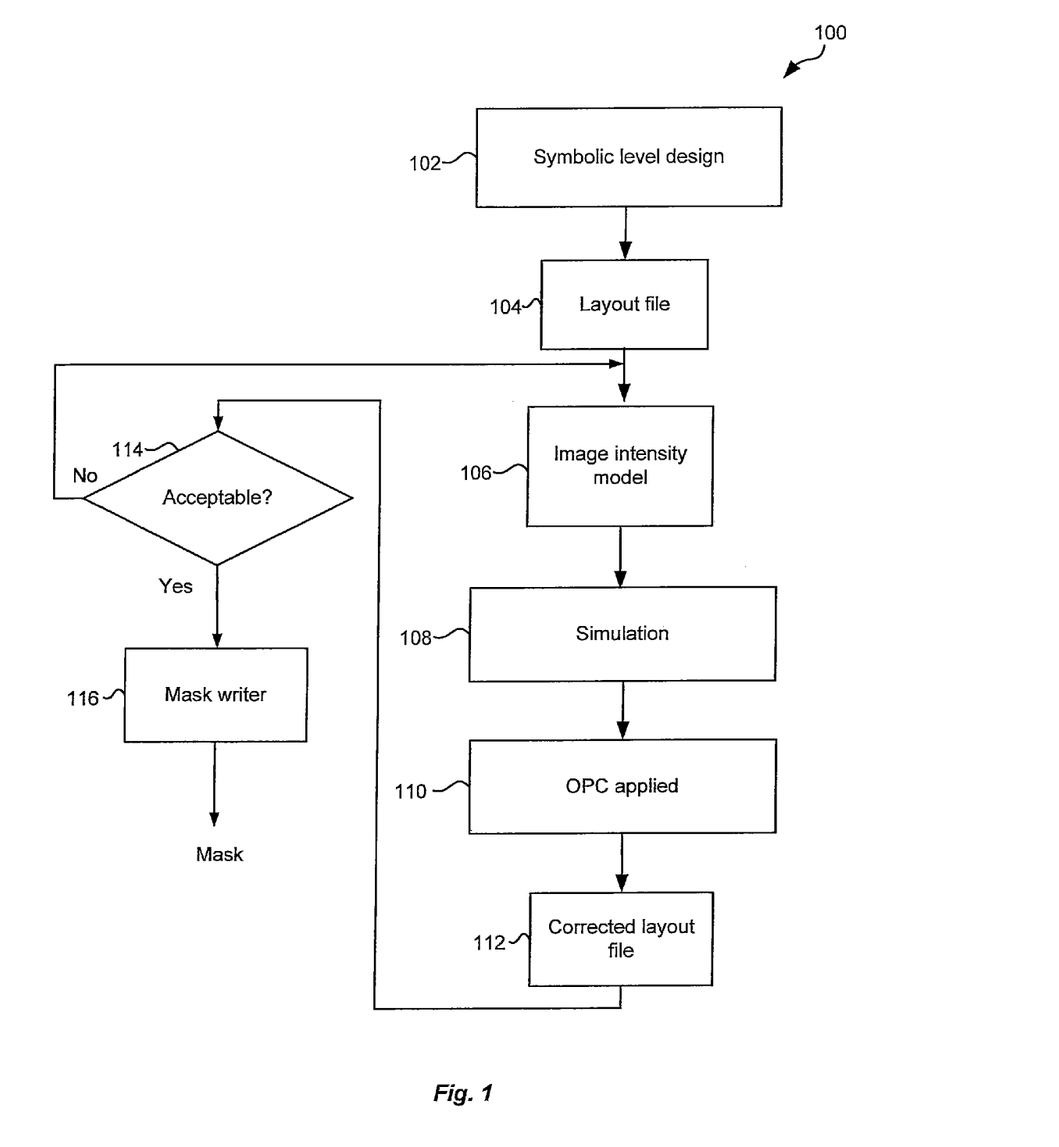
FIG. 1 depicts a design verification and RET process according to one embodiment.

FIG. 1 depicts a design verification and RET process according to one embodiment. The process includes determining a symbolic level design 102. Symbolic level design 102 may be a register transfer logic (RTL) representation of an IC design. A data layout file 104 or portion thereof, is determined that defines a desired pattern of objects to be created on a wafer. This is typically a layer of a device layout in a standard format such as graphical design system (GDS)-II or OASIS, although other formats can also be used. The data in these layers will be used to define the shape of the openings in the photolithographic reticle or mask that will be used in a photolithography system.

A simulation 108 at any given point in the image plane of an image intensity of the projected light from a photomask fabricated using data in layout file 104 is carried out using an image intensity model 106. From the results of the simulated image intensity, OPC or other RETs 110 are applied to the layout data to compensate for the predicted distortions and improve the resolution and pattern fidelity of the printed objects. A corrected layout file 112, including the results of the applied RETs, may be determined. It is then determined if corrected layout file 112 is acceptable for use in generating a mask. For example, a user or application may determine if corrected layout file 112 is acceptable or not. If not, the process may reiterate to perform the simulation again with data in corrected layout file 112.

If corrected layout file 112 is acceptable, it is provided to a mask writer 116 that produces a number of masks or reticles (hereinafter commonly referred to as a mask) used in the lithographic system to produce the desired devices on wafers.

Figure 2:
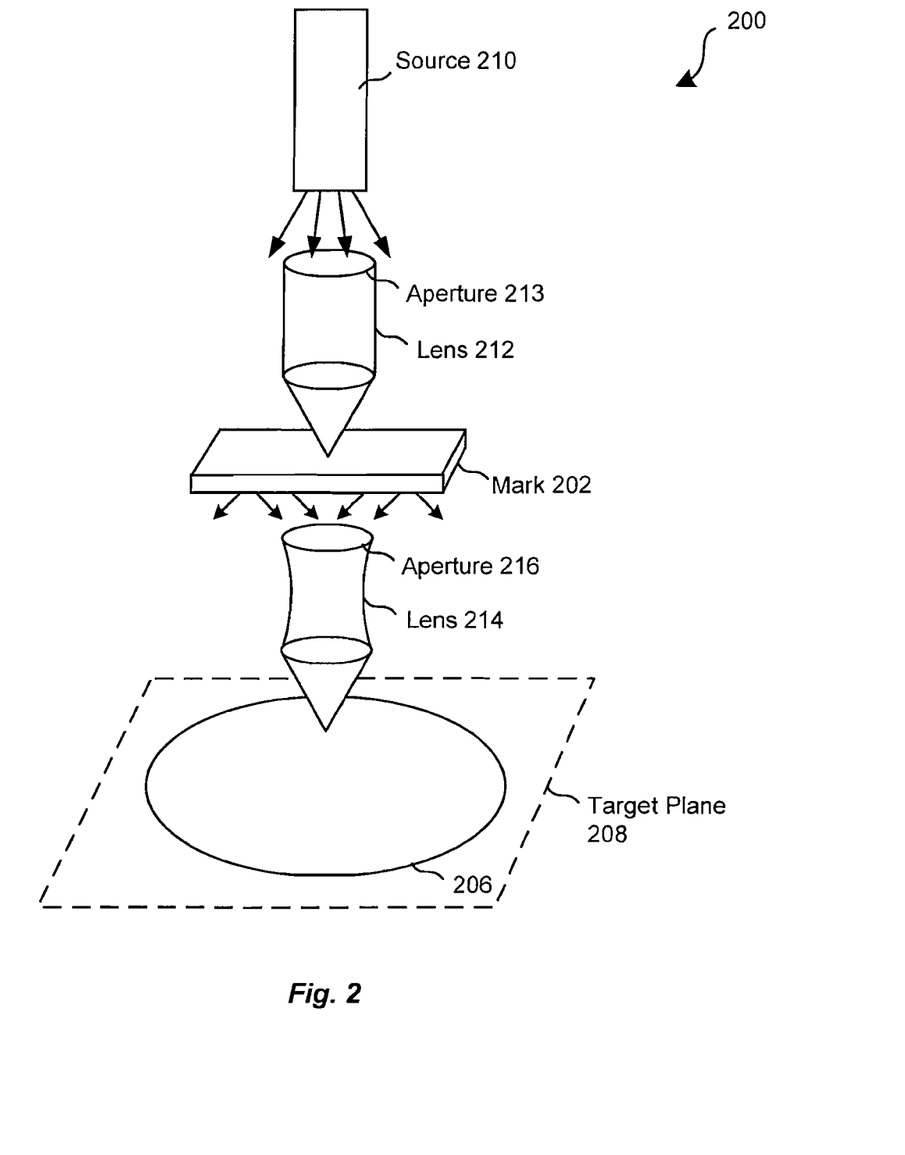
FIG. 2 is a schematic side view of a system for projection of a mask onto a target plane according to one embodiment.

FIG. 2 is a schematic side view of a system 200 for projection of a mask 202 onto a target plane 208 according to one embodiment. Typically, mask 202 embodies a predetermined design for a thin film layer that is to be formed by photolithography on a substrate 206 at plane 208, as is known in the art.

An illumination source 210 emits radiation, which typically comprises visible, ultraviolet or infrared radiation. In one embodiment, source 210 may be an examer laser. A condenser lens 212, having an aperture 213, focuses the light from source 210 through mask 202. Mask 202 may be a structure that includes a pattern for a circuit layout of an integrated circuit. The pattern is illuminated which causes diffraction in the light. The light then shines through a projection lens 214 having an aperture 216, which focuses an aerial image of mask 202 onto plane 208. Typically, lenses 212 and 214 comprise complex, multi-element lenses. The respective apertures 213 and 216 and respective distances of lenses 212 and 214 from mask 202 define respective numerical apertures.

Figure 3:
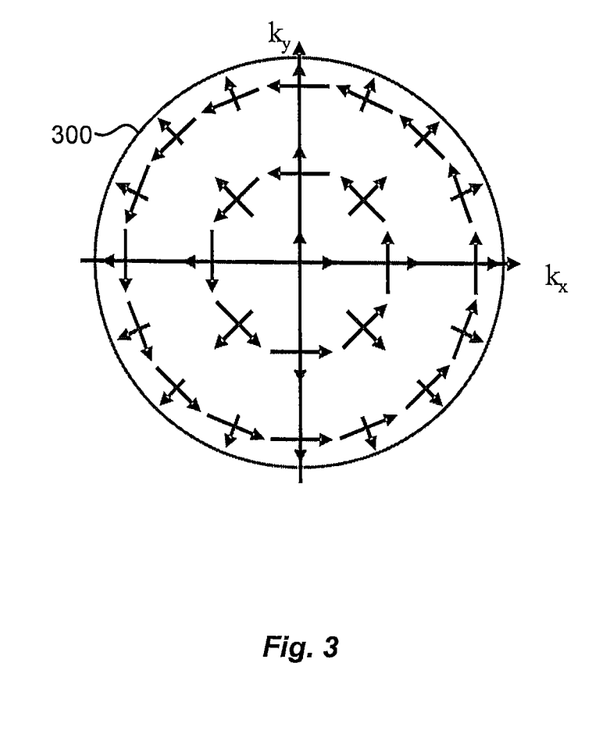
FIG. 3 depicts a source map of plane waves that is used to determine image intensity according to one embodiment.

The optical effects of objects printed onto substrate 206 in system 200 may be simulated. FIG. 3 depicts an illumination source map 300 comprising plane waves of variable polarization (represented by arrows in source map 300) that is used in the determination of the image intensity according to one embodiment. The source map may be a k-space diagram of plane waves. Source map 300 may be used to determine an image intensity for an image of mask 202 using the Hopkins approach.

The Hopkins approach is known in the art and is used to determine an image intensity leveling at the image plane. That is, the image intensity of light that results after being focused by lens 214. A Hopkins approach may be used to determine the image intensity using source map 300.

The Hopkins approach may be calculated using an integral to determine the image intensity for use in an image intensity model 106. The Hopkins imaging integral is represented by equation (1).

$$i(x, y) = \int\int\int_{-\infty}^{\infty}\int\left[\int\int_{-\infty}^{\infty} J_o(f, g)\overline{K}(f + f', g + g')\overline{K}^*(f + f'', g + g'') \right. \\ \left. df dg\right] \cdot \cdot \overline{T}_o(f', g') \\ \overline{T}_o^*(f'', g'') e^{-j2\pi[(f'-f'')x+(g'-g'')y]} df' dg' df'' dg'' \tag{1}$$

The TCCs in the Hopkins imaging integral may be approximated by a mathematical series representing a finite sum of coherent systems (SOCS). It should be noted that although the Hopkins approach is described as being used in the above process, particular embodiments may be applied for any method for which the SOCS approximation is valid. A series of kernels for the sum of coherent systems (SOCS) can be determined that represents the TCC function. A transmission cross coefficient (TCC) matrix for the function may be decomposed via Eigenvalue decomposition (EVD) into a finite set of kernels whose order of importance in the SOCS kernel series coincides with the magnitude of their respective Eigenvalue. The series is truncated to a smaller discrete number of terms as a fraction of the complete series. The discrete number of terms is then convolved with a mask transmission function to determine the image intensity. The mask transmission function is derived from parameters related to the geometries in a layout that are used to print the mask. In one embodiment, equation (2) may be used to determine the image intensity:

$$i(x, y) \cong \sum_{k=1}^{N} \sigma_k |h_k(x, y) \otimes T_o(x, y)|^2 \quad (2)$$

Conventionally, the number of kernels in the SOCS series is truncated. The SOCS series is only based on the TCC function, which is derived from parameters of the optical system used. This does not take into account the layout of the photomask being used. Thus, no matter which object is being simulated in an OPC process, the TCC function will be the same. When the kernels are selected, the series is cut off at a certain number of kernels that have the highest weights, such as the top 10, based for example on the eigenvalue magnitude. These kernels, however, may not be the most relevant to the object being simulated. Accordingly, particular embodiments use information about an object that is being simulated to determine which kernels should be included in the finite set of kernels to determine the image intensity. The object may be information for mask 202, information about the layout, or other information for the object. It should be understood that the term object, mask, and layout may be used interchangeably. In one embodiment, the information may be about the geometries of the object. For example, geometric information may be information for the object is in the layout or in mask 202.

The kernels that may be selected may provide better simulation accuracy. Also, the speed of simulation may be improved for this degree of accuracy, because the most relevant kernels are included in the SOCS series.

In one embodiment, a process may use the kernels and object information to rank the kernels. A partial sum may be computed for different locations in source map 300. For example, if equation (2) is applied at a single point, the equation may simplify to an integral of a kernel and the mask transmission function at the point. The kernel includes a weight and can be multiplied by a value of the mask transmission function at the point. This may yield a partial value for the sum. This process may be repeated for different points, where different kernels may be used for different points. Also, the mask transmission function may have different values at the different points. This yields different partials values, which may be evaluated to determine which kernels yielded results such that they may be considered more relevant to the object. For example, if a kernel with a weight that ranks it seventh in the series based on eigenvalue magnitude yields a lower partial value than a kernel ranked with a lower eigenvalue weight, then the kernel ranked with a lower weight may be moved up in the series and be associated with a higher rank and the kernel ranked seventh may be moved down in the series and be associated with a lower rank. It will be understood that other ways of determining the importance of kernels and re-ordering the kernels will be appreciated. However, in any method used, the information for the object is used to determine the re-ordering.

Thus, by using information from the object to be simulated, the computational accuracy of the SOCS approximation may be significantly improved because kernels that are more relevant to the object may be selected for use in the approximation. Also, if fewer kernels are used, the approximation may be more accurate but can also be performed faster. Accordingly, a geometry-aware SOCS solution is provided.

Figure 4:
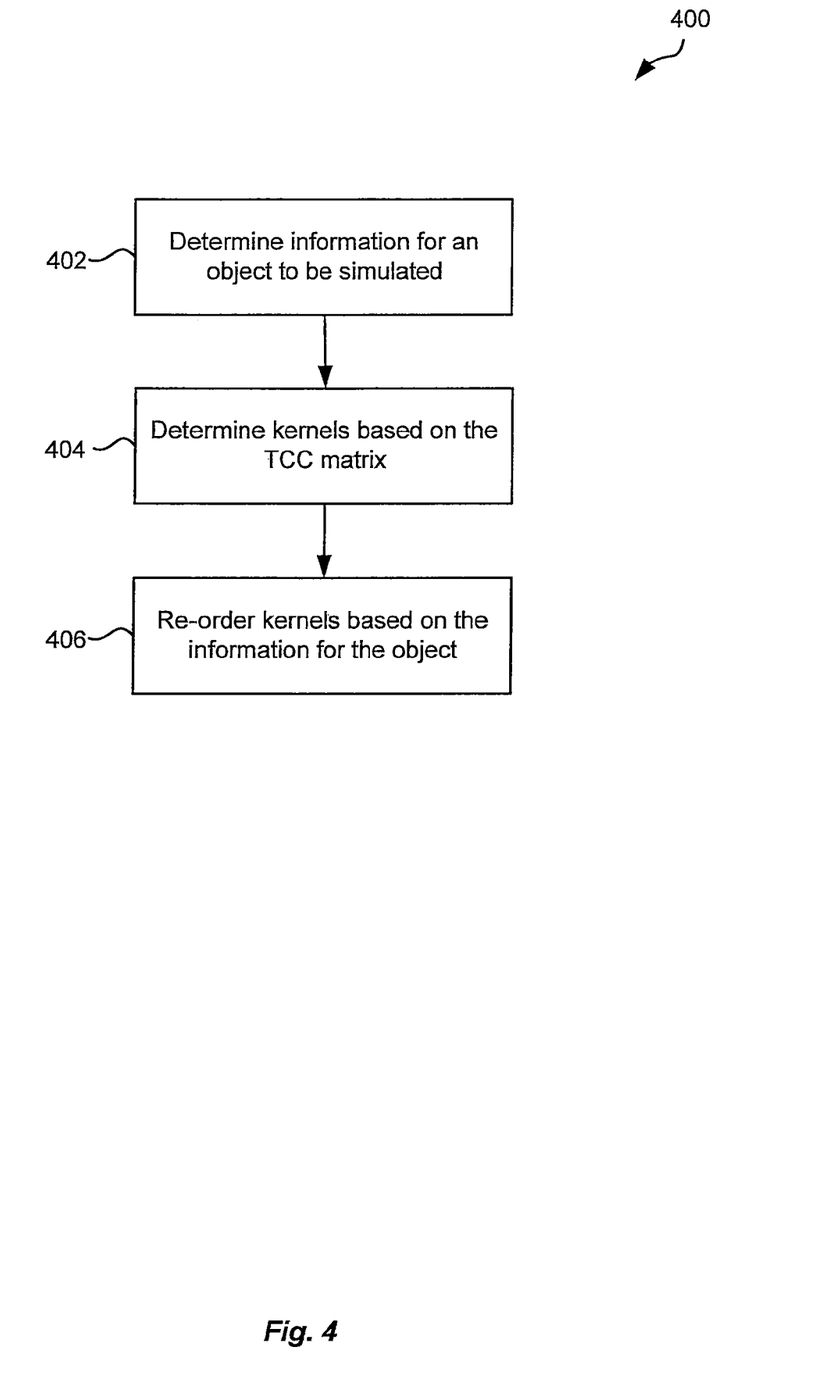
FIG. 4 depicts a simplified flowchart of a method for reordering kernels in a SOCS approximation.

FIG. 4 depicts a simplified flowchart 400 of a method for re-ordering kernels in a SOCS approximation. Step 402 determines information for an object to be simulated. For example, the information may include information about the geometries of the object.

Step 404 determines kernels based on the TCC matrix. Although a TCC is described, it will be understood that other functions may be used. For example, any functions that can be expressed as a sum of coherent systems may be used. The TCC matrix may be determined based on the illumination source and optical system used. A person skilled in the art will appreciate how to calculate the TCC matrix based on parameters of the optical system. Briefly, the kernels of the SOCS series may be determined using an Eigenvalue decomposition to determine a finite set of SOCS kernels. The finite set of kernels is determined based on parameters that do not have to do with the object being simulated. For example, the parameters based on the illumination source and optical system are used to determine the SOCS kernels. The SOCS kernels are weighted based on the Eigenvalues assigned to the kernel. For example, one Eigenfunction corresponds to each distinct Eigenvalue. The weights may be considered an importance value and the kernels are ordered in order of importance based on the weights. Conventionally, an N number of kernels were selected and used to determine the image intensity for the Hopkins imaging integral. However, particular embodiments re-order the kernel importance based on the effect of the object to be simulated. Thus, step 406 re-orders kernels based on the information for the object. For example, if kernels are considered more important than kernels with higher weights in the SOCS series, they would be assigned weights that are higher in the series. The determination indicates kernels that may be better for the different geometries that are provided in a layout. For example, the first object may be better simulated using a first set of kernels and a second object may be better simulated using a second set of kernels.

Figure 5:
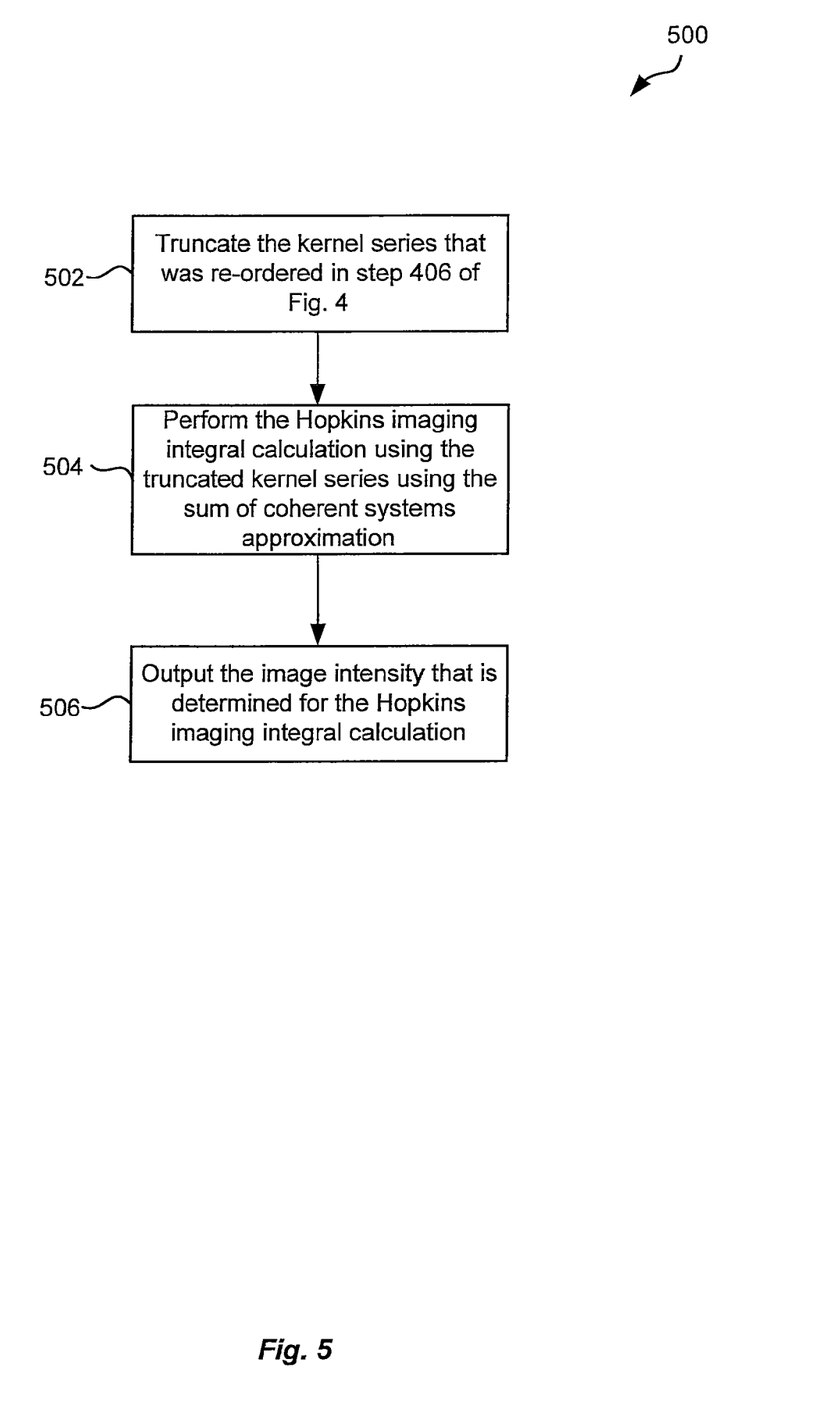
FIG. 5 depicts a simplified flowchart of a method for determining the image intensity.

The SOCS series may then be used to determine the image intensity for the Hopkins imaging integral. FIG. 5 depicts a simplified flowchart 500 of a method for determining the image intensity. Step 502 truncates the kernel series that was re-ordered in step 406 of FIG. 4. For example, an N number of kernels may be selected.

Step 504 performs the Hopkins imaging integral calculation using the truncated kernel series using the sum of coherent systems approximation. For example, the convolution over the entire source map 300 may be performed. A person skilled in the art will appreciate how to calculate the image intensity using the SOCS approximation.

Step 506 then outputs the image intensity that is determined for the SOCS approximation. For example, the image intensity may be used in a model 106 to simulate the optical effects of a manufacturing process on the object in the layout. Then, layout data may be changed to compensate for predicted distortions.

Figure 6:
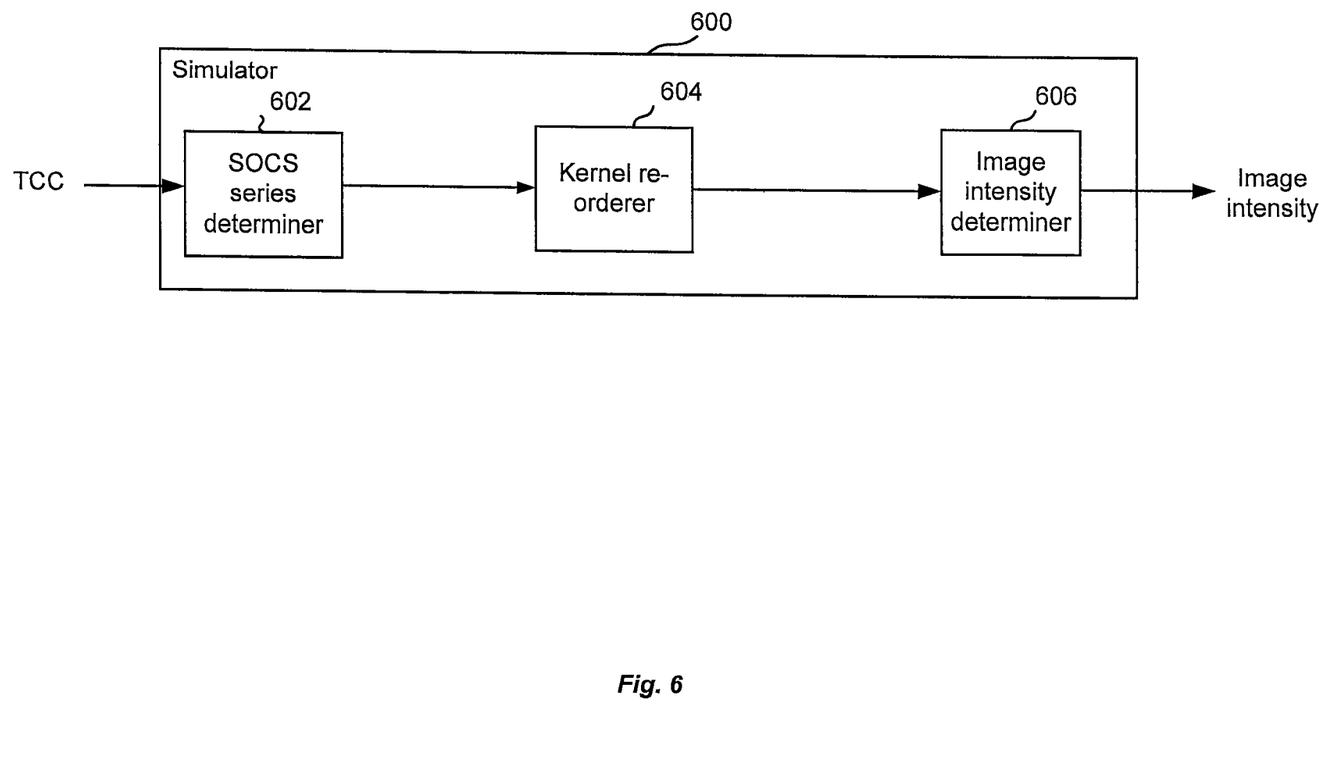
FIG. 6 depicts a more detailed example of a simulator according to one embodiment.

FIG. 6 depicts a more detailed example of a simulator 600 according to one embodiment. As shown, simulator 600 includes a SOCS series determiner 602, a kernel re-orderer 604, and an image intensity determiner 606.

SOCS series determiner 602 is configured to receive a TCC function and determine a SOCS series. For example, the TCC function may be used to determine the SOCS series. Depending on the number of TCC functions used, many SOCS series may be determined. For example, if source map 300 is partitioned in multiple sectors and the Hopkins approach is applied in each sector, then each sector would have a different TCC function.

Kernel re-orderer 604 is then configured to re-order the kernels in the SOCS series. For example, object information may be used to determine which kernels should be considered most important. The kernels are then re-ordered to correspond to different weights.

Image intensity determiner 606 determines the image intensity using the re-ordered SOCS series. For example, the series is truncated at a certain point. Then the kernels are used to determine the image intensity. The point for truncation may be different for various calculations. For example, the number N may be pre-set by a user. Also, the point to truncate the series may depend on how important kernel re-orderer 604 determines each kernel is. If only six kernels are considered relevant and can provide the desired accuracy, then the SOCS series is truncated at six kernels. However, other calculations may need a different number of kernels. Thus, point of truncation may depend on the object to be simulated.

In one example, a model that includes the SOCS kernels 1 through 6 and a tenth kernel for a total of seven kernels may be superior to a model that contains the SOCS kernels from 1 through 8 (for a total of 8 kernels). Thus, the traditional truncation of the first eight kernels does not yield a more accurate model than a model including fewer kernels but ones that have been re-ordered (i.e., the 10th kernel is included in a truncated set of 7 kernels). Using fewer kernels also may decrease the simulation time. For example, the Hopkins imaging integral may be solved faster using fewer kernels. However, accuracy is not compromised and may be better than SOCS approximations that use a greater number of less relevant SOCS kernels.

Figure 7:
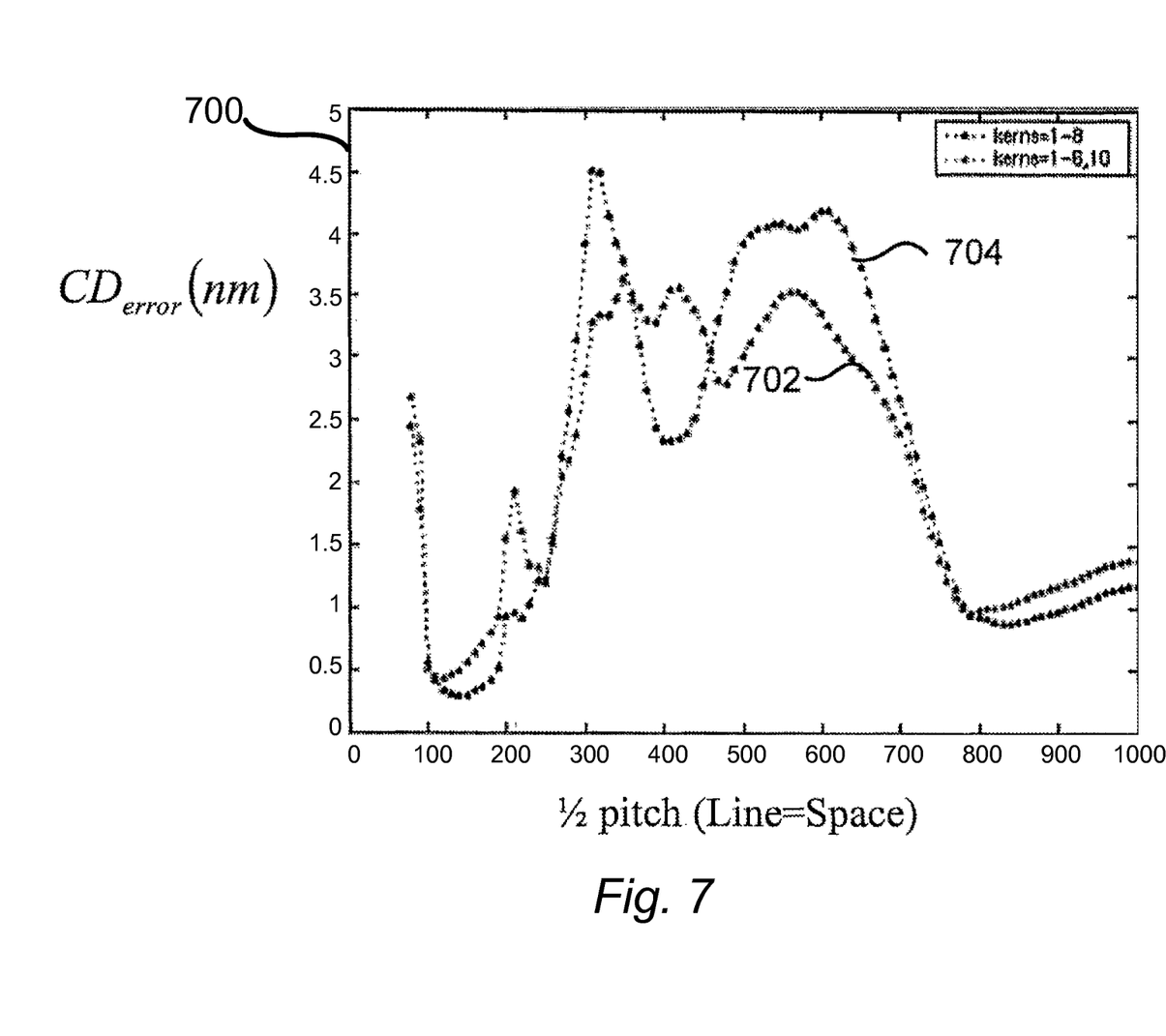
FIG. 7 shows an example of a graph showing an accuracy using particular embodiments as compared to conventional approaches according to one embodiment.

FIG. 7 shows an example of a graph 700 showing an accuracy using particular embodiments as compared to conventional approaches according to one embodiment. The above kernel selection is simulated in graph 700. As shown, a seven kernel model using appropriately selected kernels may be more accurate than an eight kernel model. The error $CD_{error}$ may be determined from a reference model, such as a model derived using the same optical system and a full or larger set of SOCS kernels. The results for different line sizes in a manufacturing process are used to show the difference in accuracy. As shown, an accuracy result 702 for the seven kernel model shows less error for an accuracy result 704 for the eight kernel model.

Although the description has been described with respect to particular embodiments thereof, these particular embodiments are merely illustrative, and not restrictive. Although particular embodiments are described with respect to the creation of integrated circuits, it will be appreciated that the techniques of particular embodiments may be applied to any manufacturing process that is subject to process variations. Examples of processes include, but are not limited to, mask bias, overlay errors, film stack thickness variations, mask phase errors, post-exposure bake temperatures, resist development times and post exposure bake times. Other devices fabricated lithographically where particular embodiments may be applied may include Micro-electromechanical systems (MEMS), magnetic heads for disk drives, photonic devices, diffractive optical elements, nanochannels for transporting biological molecules, etc.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing. Functions can be performed in hardware, software, or a combination of both. Unless otherwise stated, functions may also be performed manually, in whole or in part.

In the description herein, numerous specific details are provided, such as examples of components and/or methods, to provide a thorough understanding of particular embodiments. One skilled in the relevant art will recognize, however, that a particular embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of particular embodiments.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory.

Particular embodiments can be implemented in the form of control logic in software or hardware or a combination of both. The control logic, when executed by one or more processors, may be operable to perform that what is described in particular embodiments.

A "processor" or "process" includes any human, hardware and/or software system, mechanism or component that processes data, signals, or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope, as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

I claim:

1. A method, comprising:
   determining information for an object to be simulated for a photolithographic manufacturing process using a sum of coherent systems (SOCS) approximation;
   determining a set of kernels for use in the SOCS approximation, wherein one or more of the kernels in the set are associated with importance values, and wherein the set of kernels are in a first order based on the importance values;
   using a computer, analyzing the set of kernels and the information for the object to determine a different importance value for one or more of the kernels in the set of kernels; and
   assigning a different importance value for one or more kernels in the set of kernels based on the analysis.

2. The method of claim 1, further comprising re-ordering the kernels into a second order based on the different importance values assigned to the one or more kernels.

3. The method of claim 2, further comprising truncating the reordered kernels at a truncation point in the second order.

4. The method of claim 3, wherein the truncation point is based at least in part on the object to be simulated.

5. The method of claim 3, further comprising using the truncated kernels to calculate an image intensity without using a Hopkins approach.

6. The method of claim 1, wherein the set of kernels is not based on a transmission cross coefficient (TCC) function.

7. The method of claim 1, wherein the information for the object is geometric information, and wherein the geometry information is used to determine the importance values associated with the one or more kernels.

8. The method of claim 1, further comprising computing two or more partial sums for different respective locations in a source map, the source map being used in the SOCS approximation.

9. The method of claim 1, wherein a first kernel in the set of kernels is for a first location in a source map and a second kernel in the set of kernels is for a second, different, location in the source map.

10. The method of claim 1, wherein the object is a first object, the set of kernels is a first set of kernels, the SOCS approximation is a first SOCS approximation, and the importance values are first importance values, the method further comprising:
    determining information for a second object to be simulating using a second SOCS approximation;
    determining a second set of kernels for use in the second SOCS approximation, wherein one or more of the kernels in the second set are associated with second importance values, wherein at least one of the kernels in the second set is not in the first set of kernels;
    analyzing the second set of kernels and the information for the second object to determine if one or more of the kernels in the second set of kernels should have a different importance value; and
    assigning a different importance value for one or more kernels in the second set of kernels based on the analysis of the second set of kernels.

11. The method of claim 1, wherein the object comprises at least a portion of a layout for an integrated circuit design.

12. The method of claim 1, wherein the object comprises at least a portion of a photolithographic reticle or photomask design for manufacturing integrated circuits.

13. A computer-readable storage device or memory storing one or more computer-readable instructions that when executed by a computer cause the computer to perform a method, the method comprising:
    receiving information for an object to be simulated for a manufacturing process using a sum of coherent systems (SOCS) approximation;

receiving a set of kernels for use in the SOCS approximation, wherein one or more of the kernels in the set are associated with importance values, and wherein the set of kernels are in a first order according to their importance values;

analyzing the set of kernels and the information for the object to determine if one or more of the kernels in the set of kernels should have a different importance value; and assigning one or more different importance values for one or more kernels in the set of kernels based on the analysis.

14. The computer-readable storage device or memory of claim 13, wherein the method further comprises re-ordering the kernels into a second order based on the different importance values assigned to the one or more kernels.

15. The computer-readable storage device or memory of claim 13, wherein the method further comprises truncating the kernels based at least in part on the different importance values.

16. The computer-readable storage device or memory of claim 15, wherein the method further comprises using the truncated kernels to calculate an image intensity not using a Hopkins approach.

17. The computer-readable storage device or memory of claim 13, wherein the method further comprises truncating the kernels based at least in part on the object to be simulated.

18. The computer-readable storage device or memory of claim 13, wherein the received set of kernels is not based on a transmission cross coefficient (TCC) function.

19. A method, comprising:
determining information for an object to be simulated for a photolithographic manufacturing process using a SOCS approximation;

transmitting at least a portion of the information for the object to a computer at a remote location; and receiving information from the computer, wherein the received information is based at least in part on a set of re-ordered kernels for the SOCS approximation, the re-ordered kernels being re-ordered based at least in part on different importance values derived based at least in part on the information for the object.

20. The method of claim 19, wherein the received information comprises at least one or more of the following:

data representing one or more image intensities calculated using the re-ordered kernels;

data representing one or more of the re-ordered kernels;

data representing a subset of the set of re-ordered kernels, the subset being truncated at a truncation point after a series of kernels in the set of re-ordered kernels;

data representing a location for a truncation point after a series of kernels in the set or re-ordered kernels;

layout data for fabricating the object using the photolithographic manufacturing process, wherein the layout data is generated using the re-ordered kernels; or photolithographic reticle or photomask data for fabricating the object using the photolithographic manufacturing process, wherein the photolithographic reticle or photomask data is generated using the re-ordered kernels.

* * * * *